United States Patent
Mizutani et al.

(10) Patent No.: US 8,173,306 B2
(45) Date of Patent: *May 8, 2012

(54) CATALYST, METHOD FOR PRODUCING CATALYST, MEMBRANE ELECTRODE ASSEMBLY, AND FUEL CELL

(75) Inventors: Itsuko Mizutani, Yokohama (JP); Wu Mei, Yokohama (JP); Taishi Fukazawa, Fuchu (JP); Takahiro Sato, Kawasaki (JP); Yoshihiko Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 983 days.

This patent is subject to a terminal disclaimer.

(21) Appl. No.: 12/050,497

(22) Filed: Mar. 18, 2008

(65) Prior Publication Data

US 2008/0233465 A1    Sep. 25, 2008

(30) Foreign Application Priority Data

Mar. 19, 2007    (JP) ................................. P2007-70344

(51) Int. Cl.
| | |
|---|---|
| H01M 8/00 | (2006.01) |
| C22C 27/02 | (2006.01) |
| C22C 5/04 | (2006.01) |
| B01J 23/00 | (2006.01) |
| B01J 21/00 | (2006.01) |
| B01J 20/00 | (2006.01) |
| B01J 29/00 | (2006.01) |
| B01J 37/00 | (2006.01) |

(52) U.S. Cl. ......... 429/400; 502/305; 502/306; 502/309; 502/311; 502/312; 502/313; 502/326; 502/339; 502/349; 502/350; 502/353; 420/427; 420/462; 420/466; 420/468

(58) Field of Classification Search .................. 502/305, 502/308, 309, 311, 312, 313, 326, 339, 349, 502/350, 353; 420/427, 462, 466, 468
See application file for complete search history.

(56) References Cited

U.S. PATENT DOCUMENTS 3,414,439 A * 12/1968 Adlhart ........................ 429/442
(Continued)

FOREIGN PATENT DOCUMENTS
JP    2005-259557    9/2005

OTHER PUBLICATIONS

U.S. Appl. No. 12/121,282, filed May 15, 2008, Fukazawa et al.
(Continued)

*Primary Examiner* — Cam N. Nguyen
(74) *Attorney, Agent, or Firm* — Oblon, Spivak, McClelland, Maier & Neustadt, L.L.P.

(57) ABSTRACT

A catalyst is provided and includes fine catalyst particles of a composition represented by formula (1): $Pt_uRu_xTa_yT_z$, in which T is at least one element selected from the group consisting of Hf, W, Ni, and V; u, x, y, and z are 10 to 98.9 atm %, 0.1 to 50 atm %, 0.5 to 35 atm %, and 0.5 to 35 atm %, respectively, or formula (2): $Pt_uRu_xTa_yT_z$, in which T is at least one element selected from the group consisting of Ct, Mo, Nb, Zr, and T; u, x, y, and z are 40 to 70 atm %, 0.1 to 50 atm %, 0.5 to 15 atm %, and 0.5 to 15 atm %, respectively.

21 Claims, 1 Drawing Sheet

U.S. PATENT DOCUMENTS

| | | | |
|---|---|---|---|
| 4,294,608 A * | 10/1981 | Sedlak et al. | 420/462 |
| 4,764,435 A * | 8/1988 | Hosizaki et al. | 428/621 |
| 5,939,220 A * | 8/1999 | Gunner et al. | 429/524 |
| 6,171,721 B1 | 1/2001 | Narayanan et al. | |
| RE39,074 E * | 4/2006 | Borchert et al. | 562/548 |
| 7,579,298 B2 * | 8/2009 | Mei et al. | 502/339 |
| 7,608,560 B2 * | 10/2009 | Fan et al. | 502/313 |
| 7,659,224 B2 * | 2/2010 | Shimazaki et al. | 502/180 |
| 7,662,740 B2 * | 2/2010 | Chondroudis et al. | 502/180 |
| 7,727,930 B2 * | 6/2010 | Mei et al. | 502/326 |
| 7,759,277 B2 * | 7/2010 | Fukazawa et al. | 502/242 |
| 7,846,862 B2 * | 12/2010 | Mei et al. | 502/300 |
| 2003/0008197 A1 * | 1/2003 | Gorer | 429/40 |
| 2003/0073575 A1 * | 4/2003 | Gorer | 502/339 |
| 2004/0166396 A1 * | 8/2004 | Gorer | 429/40 |
| 2007/0184332 A1 * | 8/2007 | Park et al. | 429/40 |
| 2007/0254806 A1 | 11/2007 | Mei et al. | |
| 2010/0035123 A1 * | 2/2010 | Narayanan et al. | 429/40 |

OTHER PUBLICATIONS

U.S. Appl. No. 12/049,739, filed Mar. 17, 2008, Mei et al.
U.S. Appl. No. 12/201,332, filed Aug. 29, 2008, Tamura et al.
U.S. Appl. No. 11/863,798, filed Sep. 28, 2007, Mei et al.
U.S. Appl. No. 11/863,856, filed Sep. 28, 2007, Mei et al.

* cited by examiner

CATALYST, METHOD FOR PRODUCING CATALYST, MEMBRANE ELECTRODE ASSEMBLY, AND FUEL CELL

The present application is based upon and claims the benefit of priority from Japanese Patent Application No. JP2007-70344 filed on Mar. 19 of 2007, the entire disclosure of which is incorporated herein by reference. JP2007-70344 has now been withdrawn. Domestic priority to JP2007-70344 was claimed in JP2008-59771 filed on Mar. 10, 2008, which was published on Oct. 30, 2008 as unexamined published Japanese Patent Application No. JP2008-262903.

BACKGROUND OF THE INVENTION i) Field of the Invention

The present invention relates to a catalyst, a membrane electrode assembly, a fuel cell, and a method for producing the catalyst.

ii) Related Art

Recently, a fuel cell has been studied to be put to practical use for a vehicle, a home, or the like. For example, a polymer electrolyte fuel cell using a methanol solution as fuel can be reduced in size and weight and can be continuously driven by supplying fuel. Accordingly, the fuel cell is actively studied currently. However, the performance thereof does not reach a level to come into wide use. One of the reasons is the insufficient activity of an electrode catalyst. Since the fuel cell converts chemical energy into electric energy by catalysis reaction in the electrode, a catalyst with a high activity is indispensable to develop a high-performance fuel cell. Generally, PtRu is used as an anode catalyst of the fuel cell, but a voltage loss by the PtRu catalyst is about 0.3 V in a theoretical voltage 1.21 V which can be obtained by the catalysis reaction in the electrode. In addition, when electricity is generated for a long time, the catalyst is deteriorated to result in decreasing the performance of the fuel cell. Thus, there has been required an anode catalyst which is superior to PtRu and is stabilized in spite of the generation of electricity for a long time.

The study on the catalyst has been conducted in many fields. In U.S. Pat. No. 3,506,494, a catalyst using a ternary alloy of Pt, Ru, and a third metal (Au, Re, Ta, W, Mo, Rh, etc.) as an electrode catalyst is disclosed. In JP-A-2005-259557 (KOKAI), there is disclosed a catalyst in which as catalyst metal components, platinum, ruthenium, and at least one selected from an element of Group 4, an element of Group 5, and an element of Group 6 in the periodic table are supported by a conductive carrier. In JP-A-2006-224095 (KOKAI), there is disclosed a catalyst in which at least one element selected from Pt, Ru, Pd, and the like; and at least one element of Fe, Mo, W, and the like are supported as a catalyst. All of the above catalysts are produced by a solution method.

The above-mentioned solution method has been generally used for catalyst composition. However, the solution method has an issue that it is difficult to perform a structure control and a surface control of a catalyst for an element which is scarcely reduced and an element which scarcely alloys. Although a catalyst synthesis using a sputtering method and a vapor deposition method has an advantage for a material control, a study on an influence of a process such as an element kind, a catalyst constitution, a substrate material, and a substrate temperature has been little conducted yet. Since not a few of catalyst particles are nano-particles, a surface electron state of the catalyst particles and a nano-structure of the catalyst particles tend to greatly depend on a kind and the amount of elements added to the catalyst particles. In order to obtain catalyst particles with a high activity and a high stability, it is required to appropriately adjust the kind of the elements added to the catalyst particles, the amount of the elements, and the combination of the elements.

In U.S. Pat. No. 6,171,721, a catalyst synthesized by a sputtering method is disclosed. However, a study on a composition of elements added to catalyst particles is not sufficient yet, and a sufficient methanol oxidation activity and stability are not established.

SUMMARY OF THE INVENTION

An object of an illustrative, non-limiting embodiment of the invention is to provide a catalyst with a high activity and a high stability, a method of producing the catalyst, a membrane electrode assembly, and a fuel cell.

According to an aspect of the invention, there is provided a catalyst (a first catalyst) including fine catalyst particles of a composition represented by formula (1):

$$Pt_u Ru_x Ta_y T_z \qquad (1)$$

wherein T is at least one element selected from the group consisting of Hf, W, Ni, and V; and u, x, y, and z are 10 to 98.9 atm %, 0.1 to 50 atm %, 0.5 to 35 atm %, and 0.5 to 35 atm %, respectively.

According to an aspect of the invention, there is provided a catalyst (a second catalyst) including fine catalyst particles of a composition represented by formula (1):

$$Pt_u Ru_x Ta_y T_z \qquad (1)$$

wherein T is at least one element selected from the group consisting of Cr, Mo, Nb, Zr, and Ti; u, x, y, and z are 40 to 70 atm %, 0.1 to 50 atm %, 0.5 to 15 atm %, and 0.5 to 15 atm %, respectively.

According to an aspect of the invention, there is provided a method for producing a catalyst, comprising forming the catalyst particles in a conductive carrier by a sputtering method or a vapor deposition method.

According to an aspect of the invention, there is provided a membrane electrode assembly including: a cathode; an anode including the first catalyst or the second catalyst; and an ion exchange membrane disposed between the cathode and the anode.

According to an aspect of the invention, there is provided a fuel cell including the membrane electrode assembly.

Another aspect of the invention is a catalyst comprising fine catalyst particles having a composition represented by the following formula (1), $$Pt_u Ru_x Ta_y T_z \qquad (1)$$

(wherein T is at least one element selected from the group consisting of Ni, W, V, Hf, Cr, Mo, Nb, Zr, and Ti; u, x, y, and z are in the range of 40 to 70 atm %, 0 to 50 atm %, 0.5 to 15 atm %, and 0.5 to 15 atm %, respectively; and in an X-ray photoelectron spectroscopy (XPS), an amount of Ta having an oxygen bond is not more than twice the amount of Ta having a metal bond).

In this aspect, wherein T includes anyone of Nb, Zr, Ti, and Hf an embodiment is where in X-ray photoelectron spectroscopy (XPS), an amount of T having a metal bond is not more than twice an amount of T having an oxygen bond.

Also in this aspect, wherein T includes anyone of Ni, Mo, W, V, and Cr an embodiment is where in X-ray photoelectron spectroscopy (XPS), an amount of T having an oxygen bond is not more than twice an amount of T having a metal bond.

Also an embodiment of this aspect is a method of producing the catalyst, wherein the catalyst particles are formed in a conductive carrier kept at 400° C. or less by a sputtering method or a vapor deposition method.

Another embodiment of this aspect is a membrane electrode assembly comprising: a cathode; an anode including the catalyst; and a proton-conductive membrane disposed between the cathode and the anode, as well as a fuel cell comprising the membrane electrode assembly.

DETAILED DESCRIPTION OF THE INVENTION

According to an aspect of the present invention, it is possible to provide a catalyst with a high activity and a high stability, a method of producing the catalyst, a membrane electrode assembly, and a fuel cell.

The present inventors have made an assiduous study on a catalyst synthesis process and a catalyst composition. As a result, it has been found that when catalyst particles represented by formula (1) or formula (2), in which Ta and a specific element (element T) are added to a PtRu alloy, are formed by a sputtering method or a vapor deposition method, a catalyst with a high activity and a high stability can be obtained.

A catalyst according to the invention includes fine catalyst particles having a composition represented by the following formula (1).

$$Pt_u Ru_x Ta_y T_z \quad (1)$$

(wherein T is at least one element selected from the group consisting of Ni, W, V, Hf, Cr, Mo, Nb, Zr, and Ti; u, x, y, and z are in the range of 40 to 70 atm %, 0 to 50 atm %, 0.5 to 15 atm %, and 0.5 to 15 atm %, respectively; and in an X-ray photoelectron spectroscopy (XPS), an amount of Ta having an oxygen bond is not more than twice an amount of Ta having a metal bond).

According to the invention, it is possible to provide a catalyst with a high activity and a high stability, a method of producing the catalyst, a membrane electrode assembly, and a fuel cell.

In order to accomplish the above-mentioned object, the present inventors have made an assiduous study on a catalyst synthesis process and a catalyst composition. As a result, when catalyst particles represented by the formula (1) are formed by a sputtering method or a vapor deposition method at the time when Ta and T are added to a PtRu alloy, the inventors found that a catalyst with a high activity and a high stability can be obtained.

Hereinafter, an embodiment for carrying out the invention will be described.

First, a catalyst will be described.

A first catalyst according to the present embodiment has a composition represented by the above-mentioned formula (1) and is a 4-element catalyst essentially including Pt and Ta and including Ru and a fourth element T or a 4 more-element catalyst.

Pt and Ru are main catalyst elements. Pt exhibits a catalyst action having a good oxidation reaction of hydrogen and a good dehydrogenation reaction of organic fuel. To add Ru to hydrogen gas or organic fuel containing CO is a very effective to suppress CO poisoning. Accordingly, a composition ratio of Pt and a composition ratio Ru are preferably in the range of 40 to 70 atm % and in the range of 0 to 50 atm %, respectively.

Ta-T (T is at least one element selected from the group consisting of Ni, W, V, Hf, Cr, Mo, Nb, Zr, and Ti) is a promoter. Specifically, a high activity and stability were found by adding Ta and T to Pt. The above mechanism cannot be surely known. However, it is considered that the mechanism is caused by the change in a nano-structure, a surface structure, and an electron state of catalyst particles when Pt and Ta in T coexist due to specific compositions and processes.

In the present embodiment, the amounts of Ta and T of the catalyst particles are preferably in the range of 0.5 to 15 atm % and in the range of 0.5 to 15 atm %, respectively. When each of the amounts is greater than 15 atm %, the number of main active sites consisting of Pt atoms may decrease and a catalyst activity may be degraded. In the present embodiment, each of the amounts of Ta and T of the catalyst particles is more preferably in the range of 3 to 10 atm %.

In XPS measurement, when X exists in a sample, intrinsic energy of metal X is detected; the detected energy is recognized as a peak; and thus existence and a bond state of the element can be appreciated. In addition, X can be measured on the basis of the peak area. As a result of the examination in the bond state of Ta or T by the use of the XPS measurement, when T is at least one element selected from the group consisting of Ni, Mo, W, V, and Cr, the metal bond of Ta and the bond of T may exist respectively. The proportion of the oxygen bond may be higher than that of the metal bond. This is measured from the peak area of the XPS. When T is at least one element selected from the group consisting of Nb, Zr, Ti, and Hf, the metal bond exists. However, the oxygen bond also exists, and the proportion thereof may be greater than that of the metal bond. It is considered that the existence of the metal bond between T or Ta and Pt are specifically important to improve the activity. When a surface analysis for the catalyst particles synthesized by the known solution method is conducted based on the X-ray photoelectron spectroscopy (XPS), most of Ta and T are bound with other elements with an oxygen bond. On the contrary, in the catalyst according to the present embodiment, T and Ta exist in the metal bond state. The existence of the metal bond between the Ta and Pt contributes to the improvement of the stability of the catalyst according to the present embodiment.

A conductive carrier for supporting the catalyst particles had better have a good conductivity and a good stability. Recently, nano-carbon materials such as a fiber shape, a tube shape, and coil shape have been developed. Since the surface states of the materials are different from one another and the catalyst particles are supported with such a conductive carrier, the activity may be more improved. Further, the catalyst particles may be supported with conductive oxides in addition to the carbon materials. An additional synergistic effect between the oxide carrier and the catalyst according to the present embodiment is expected. For example, in case of the oxide carrier, an advantage of changing the electron state of the supporting catalyst particles is expected in addition to the difference in the surface states of the carbon material. Moreover, an advantage of suppressing the CO poisoning is expected due to the oxygen donation from the oxides.

Next, a method of producing the catalyst according to the present embodiment will be described. It is difficult to produce the catalyst according to the embodiment by a solution method such as an impregnation method, a precipitation method, and a colloid method; and an electrocrystallization method using electrical crystallization. Accordingly, in the present embodiment, the catalyst is produced by a sputtering method and a vapor deposition method. By using the sputtering method and the vapor deposition method, it is possible to produce metal that cannot be reduced by the solution method or the electrocrystallization method or alloy thereof. In addition, it is possible to simply control the composition of the alloy.

When the sputtering method or the vapor deposition method is used, an alloy target may be used and a simultaneous sputtering or a simultaneous vapor deposition may be performed using each metal target of the constituent elements. The structure of the catalyst can be greatly changed by controlling the temperature of a sputtering substrate. Further, it is possible to enhance crystallization and to change particle diameters. The temperature of the carrier in the sputtering method is preferably 400° C. or less.

As the sputtering carrier, the nano-carbon materials (which are enough stirred so as to disperse particles and are sputtered with vibrating) may be used as described above. The catalyst according to present embodiment may be directly sputtered on a porous paper, an electrode diffusion layer, or an electrolyte membrane. The activity may be further improved by performing a later-heat treatment on the catalyst. The catalyst structure or the surface structure becomes further appropriate by the heat treatment. The later-heat treatment is performed preferably at the temperature of 400° C. or less and under oxygen partial pressure less than 5%.

The catalyst particles are formed by the sputtering method or the vapor deposition method and then an acid washing treatment or the heat treatment is performed, or the surface structure due to the acid washing thereby further improving the that the catalyst structure becomes further appropriate activity. The reason is treatment or the heat treatment. Although acid aqueous solution may be used for the acid washing treatment, sulfuric acid aqueous solution was used in the present embodiment. The later-heat treatment is performed preferably at the temperature of 10 to 400° C. and under oxygen partial pressure less than 5%. Since the fine particles are easily formed, other materials such as carbon and constituent metal elements may be sputtered or deposited simultaneously. In the present embodiment, metal with a good dissolubility such as Cu and Zn and the constituent metal elements are simultaneously sputtered or deposited and then Cu, Zn, and the like may be removed.

Hereinafter, an embodiment of a structure of a fuel cell according to the invention will be described.

Figure 1:
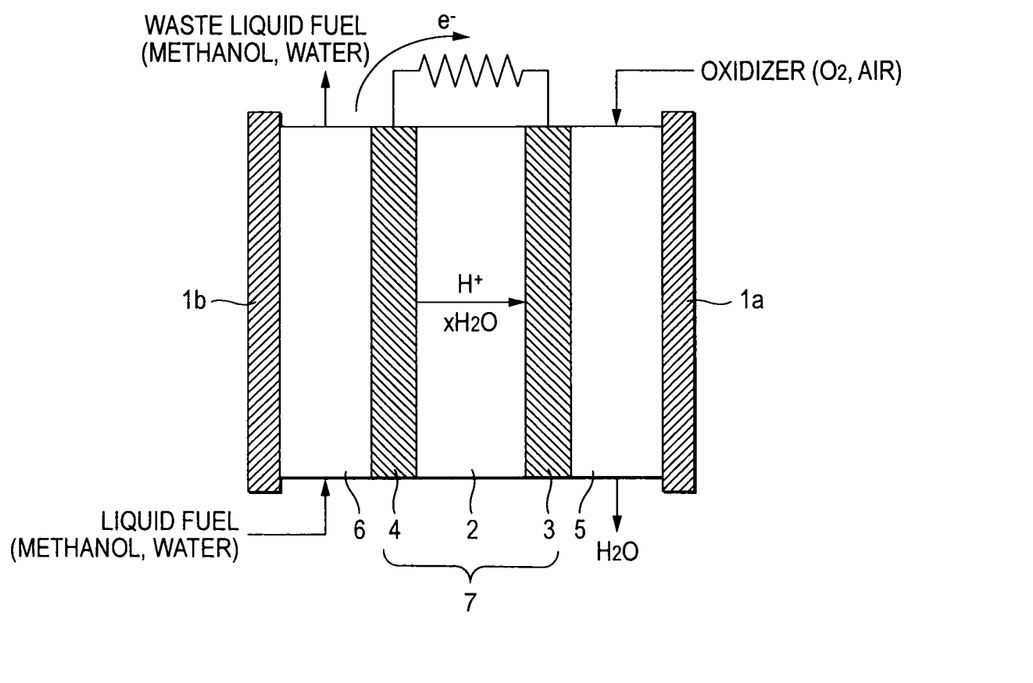
The sole FIGURE is a schematic diagram illustrating an exemplary embodiment of a direct methanol fuel cell.

FIG. 1 is a schematic diagram illustrating a unit cell of a fuel cell. As shown in FIG. 1, the fuel cell includes chassis $1a$ and $1b$; an electrolyte membrane 2 in the chassis $1a$ and $1b$; an oxidizer electrode (cathode) 3 and a fuel electrode (anode) 4 with the electrolyte membrane 2 interposed therebetween; and an oxidizer channel 5 and an liquid fuel channel 6 outside the oxidizer electrode 3 and the fuel electrode 4

An ion exchange membrane is used as the electrolyte membrane 2. Although the ion exchange membrane may be used in an ion conductive type of a negative ion or a positive ion, the ion exchange membrane is mainly used in a proton-conductive type. For example, materials having a negative ion or positive ion conductivity such as a polymer membrane represented by perfluoroalkylsulfonate polymer may be used.

The electrolyte membrane 2 is interposed between the oxidizer electrode 3 and the fuel electrode 4 or three members are attached by a hot-pressing, a cast film-forming, or the like, thereby forming a membrane electrode assembly. A water repellent represented by polytetrafluoroethylene may be add to or plied on the porous carbon paper if necessary.

The fuel electrode 4 is an electrode including the above-described methanol oxide catalyst as an effective component. The fuel electrode 4 is brought in close contact with the electrolyte membrane 2. As a method of bringing the fuel electrode 4 in close contact with the electrolyte membrane 2, the know method including the hot pressing method and the cast film-forming method may be used.

In most cases, the oxidizer electrode 3 is configured to mix carbon supporting platinum with ion conductive materials and then to be brought in close contact with the electrolyte membrane 2. When the ion conductive materials are the same as materials of the electrolyte membrane 2, the preferred result can be obtained. As a method of bringing the oxidizer electrode 3 in close contact with the ion exchange membrane 2, the known method including the hot pressing method and the cast film-forming method may be used. As the oxidizer electrode 3 in addition to carbon supporting platinum, the known materials such as a precious metal or a carrier (electrode catalyst) thereof and an organometallic complex or a calcination thereof may be used. Further, the oxidizer electrode 3 may be used in an unsupported state where the materials are not supported with the carrier as it stands.

An oxidizer introduction hole (not shown) for introducing oxidizer (air in most cases) is formed in the upper portion of the oxidizer electrode 3. An oxidizer discharge hole (not shown) for discharging non-reacted air and a product (water in most cases) is formed in the lower portion thereof. In this case, a compulsory exhauster and/or compulsory exhaust means may be additionally disposed. A spontaneous convection hole for may be formed in the chassis $1a$.

The liquid fuel channel 6 is provided outside the fuel electrode 4. The liquid fuel channel 6 may be a channel for fluid communication with an external fuel storing portion (not shown) or with a portion for storing methanol fuel. A discharge hole (not shown) for discharging non-reacted methanol fuel and a product ($CO_2$ in most cases) is formed in the lower portion of the fuel electrode 4. In this case, a compulsory discharger or compulsory means may be additionally disposed.

Methanol itself or mixture of methanol and water is suitable for fuel supplied to the fuel electrode 4. However, when the mixture of methanol and water is used as fuel, crossover can be effectively prevented, thereby obtaining better electromotive force and output.

Only unit cell is illustrated in a schematic diagram of a direct methanol fuel cell shown in FIG. 1. However, in the present embodiment, the unit cell may be used as it stands, or a plurality of cells may be connected to one another in series or parallel to be used as a mounting fuel cell. As a method of connecting cell to cell, the known connection method using a bipolar plate may be employed or a planar connection method may be employed.

It is also effective to employ the other known connection methods. Ethanol, formic acid, or aqueous solution including at least one of them may be used as fuel, in addition to methanol.

Hereinafter, exemplary embodiments for carrying out the invention will be described.

First, a catalyst will be described.
(First Catalyst)

A first catalyst according to an exemplary embodiment has a composition represented by the above-mentioned formula (1) and is a ternary (3-element) or quaternary (4-element) catalyst including Pt and Ta and also including Ru and/or a fourth element T, or a 4 more-element catalyst.

Pt and Ru are main catalyst elements. Pt exhibits a good catalyst action for an oxidation reaction of hydrogen and a dehydrogenation reaction of organic fuel. To add Ru to hydrogen gas or organic fuel containing CO is a very effective to suppress CO poisoning. Accordingly, a composition ratio of Pt and a composition ratio of Ru are preferably in the range of 10 to 98.9 atm % and in the range of 0.1 to 50 atm %, respectively, which are the ranges in which the effect of each of Pt and Ru can be most-exhibited.

Ta-T (T is at least one element selected from the group consisting of Hf, W, Ni, V, Cr, Mo, Nb, Zr, and Ti) is a cocatalyst. Specifically, a high activity and stability were obtained by adding Ta and T to Pt. This mechanism cannot be surely known. However, it is considered that the mechanism is caused by change in a nano-structure, a surface structure, and an electron state of catalyst particles when Pt and Ta in T coexist due to specific compositions and processes.

In the embodiment, in a case where T is at least one element selected from the group consisting of Hf, W, Ni, and V the amounts of Ta and T in the catalyst particles are preferably in the range of 0.5 to 35 atm % and in the range of 0.5 to 35 atm %, respectively. When these Ta and T elements are added in the catalyst particles, the catalyst activity is not degraded by the interaction of Ta and T even if the ratio of the added elements occupying main active sites of Pt atoms. However, when each of the amounts is greater than 35 atm %, the number of main active sites of Pt atoms may decrease and the catalyst activity may be degraded by the interaction of Ta and T.

In an X-ray photoelectron spectroscopy (XPS), when X exists in a sample, intrinsic energy of metal X is detected; the detected energy is recognized as a peak; and thus existence and a bond state of the element can be appreciated. In addition, the quantity of X can be determined on the basis of the peak area. By the investigation in the bond sate of Ta or T element by the XPS measurement, it can be found that the ratio of the oxygen bond of Ta is changed depending from the kinds or amount of T element.

When T is at least one element selected from the group consisting of W, Ni, Mo, V, and Cr, the metal bond of Ta and the bond of T exists. In many situations, the proportion of the metal bond is greater than that of the oxygen bond. In other words, the amount of the oxygen bond may be equal to or less than 10 times the amount of the metal bond. This is measured from the peak area of the XPS.

When T is at least one element selected from the group consisting of Hf, Nb, Zr, and Ti, the metal bond as well as the oxygen bond of T exists, and the proportion thereof may be greater than that of the metal bond. In other words, the amount of the metal bond may be equal to or less than twice the amount of the oxygen bond.

It is considered that the existence of the metal bond between T or Ta and Pt are specifically important to improve the activity. As a result of a surface analysis for the catalyst particles synthesized by the known solution method is conducted based on the X-ray photoelectron spectroscopy (XPS), it can be found that most of Ta and T are bound with other elements by an oxygen bond. On the contrary, in the catalyst according to the embodiment, there are T and Ta in the metal bond state. It is considered that the existence of the metal bond between Ta and Pt contributes to the improvement of the stability of the catalyst according to the embodiment.

A conductive carrier for supporting the catalyst particles is required only to have a good conductivity and a good stability. Recently, nano-carbon materials such as a fiber shape, a tube shape, and coil shape have been developed. Since the surface states of them are different from one another, the activity may be more improved by supporting the catalyst particles by such a conductive carrier. Further, the catalyst particles may not be supported by the carbon material, but supported by conductive oxides. A synergic effect between the oxide carrier and the catalyst according to the embodiment is expected. For example, in case of the oxide carrier, an advantage of changing the electron state of the supporting catalyst particles is expected in addition to the difference in the surface states as stated in the above case of the carbon material. Moreover, an advantage of suppressing the CO poisoning is expected due to the oxygen donation from the oxides.

The conductivity of the carbon material as mentioned above is higher than that of tap water by 4 to 7 order of magnitude.

(Second Catalyst)

A second catalyst according to an exemplary embodiment has a composition represented by the above-mentioned formula (2) and is a ternary (3-element) or quaternary (4-element) catalyst including Pt and Ta and also including Ru and/or a fourth element T, or a 4 more-element catalyst. The description of the content overlapping between the first and second catalysts will be omitted and the feature unique to the second catalyst will be described.

Pt and Ru are main catalyst elements. A composition ratio of Pt and a composition ratio of Ru are preferably in the range of 40 to 70 atm % and in the range of 0.1 to 50 atm %, respectively, which are ranges in which the effect of each of Pt and Ru can be most-exhibited.

In the embodiment, in a case where T is at least one element selected from the group consisting of Cr, Mo, Nb, Zr, and Ti, the amounts of Ta and T in the catalyst particles are preferably in the range of 0.5 to 15 atm % and in the range of 0.5 to 15 atm %, respectively. When these Ta and T elements are added in the catalyst particles, the catalyst activity is not degraded by the interaction of Ta and T even if the ratio of the added elements occupying main active sites of Pt atoms. However, when each of the amounts is greater than 15 atm %, the number of main active sites of Pt atoms may decrease and the catalyst activity may be degraded by the interaction of Ta and T.

The above T elements are classified into two groups with respect to their additive amounts. Of course, there is a case where an catalyst activity is improved by mixing an element from the group of Hf, W, Ni, and V and an element from the group of Cr, Mo, Nb, Zr, and Ti, as T of $Pt_uRu_xTa_yT_z$. In this case, a composition ratio of Ta and a composition ratio of Ru are preferably in the range of 0.5 to 35 atm % and in the range of 0.5 to 35 atm %, respectively.

(Method for Producing Catalyst Material)

Next, a method for producing the catalyst according to the embodiment will be described. It is difficult to produce the catalyst according to the embodiment by a solution method such as an impregnation method, a precipitation method, and a colloid method, or an electrodeposition method using electrical deposition. Accordingly, in the embodiment, the catalyst is produced by a sputtering method or a vapor deposition method. By using the sputtering method or the vapor deposition method, it is possible to produce metal that cannot be reduced by the solution method or the electrodeposition method, or alloy thereof. In addition, it is possible to simply control the composition of the alloy.

When the sputtering method or the vapor deposition method is used, an alloy target may be used, or a multi sputtering or a multi vapor deposition may be performed using metal targets of the respective constituent elements. The structure of the catalyst can be greatly changed by controlling the temperature of a sputtering substrate. Further, it is possible to enhance crystallization and to change particle diameters. The temperature of the carrier in the sputtering method is preferably 400° C. or less.

As the sputtering carrier, the nano-carbon materials may be used as described above. (In this regard, the nano-carbon materials (carrier) are stirred well to be dispersed, and then the sputtering is performed while oscillating the materials.) The catalyst according to embodiment may be directly sputtered on a porous paper, an electrode diffusion layer, or an electrolyte membrane. The activity may be sometimes improved by performing a post heat treatment on the catalyst. It is considered that further appropriate catalyst structure or surface structure can be obtained by the heat treatment. The post heat treatment is performed preferably at the temperature of 400° C. or less and under oxygen partial pressure less than 5%.

The catalyst particles are formed by the sputtering method or the vapor deposition method and then an acid washing treatment or the heat treatment may be performed, thereby further improving the activity. It is considered that the reason is that the catalyst structure or the surface structure becomes further appropriate due to the acid washing treatment or the heat treatment. Acid aqueous solution may be used for the acid washing treatment, and sulfuric acid aqueous solution is used in the embodiment. The post heat treatment is performed preferably at the temperature of 10 to 400° C. and under oxygen partial pressure less than 5%. The "oxygen partial pressure of less than 5%" means a molar fraction of oxygen of less than 5%. Since the fine particles are easily formed, other materials such as carbon and constituent metal elements may be multi-sputtered or multi-deposited. In the embodiment, metal with a good dissolubility such as Cu and Zn and the constituent metal elements may be multi-sputtered or multi-deposited, to thereby remove Cu, Zn, and the like.

Hereinafter, an exemplary embodiment of a fuel cell according to the invention will be described.

The FIGURE is a schematic diagram illustrating a unit cell of a fuel cell. As shown in the FIGURE, in chassis 1a and 1b, there are provided an electrolyte membrane 2; an oxidizer electrode (cathode) 3 and a fuel electrode (anode) 4 with the electrolyte membrane 2 interposed therebetween; and an oxidizer channel 5 and a liquid fuel channel 6 outside the oxidizer electrode 3 and the fuel electrode 4.

An ion exchange membrane is used as the electrolyte membrane 2. Although the ion exchange membrane may be used in an ion conductive type of a negative ion or a positive ion, the ion exchange membrane is mainly used in a proton-conductive type (proton conductive membrane). For example, materials having a negative ion or positive ion conductivity such as a polymer membrane represented by perfluoroalkylsulfonate polymer may be used.

The electrolyte membrane 2 is interposed between the oxidizer electrode 3 and the fuel electrode 4 or three members are attached by a hot-pressing, a cast film-forming, or the like, thereby forming a membrane electrode assembly. A water repellent represented by polytetrafluoroethylene may be add to or accumulated on the porous carbon paper if necessary.

The fuel electrode 4 is an electrode including the above-described catalyst (i.e., methanol oxide catalyst) as an effective component. The fuel electrode 4 is brought in close contact with the electrolyte membrane 2. As a method of bringing the fuel electrode 4 in close contact with the electrolyte membrane 2, the know method including the hot pressing method and the cast film-forming method may be used.

In most cases, the oxidizer electrode 3 is configured to mix carbon supporting platinum with ion conductive materials and then to be brought in close contract with the electrolyte membrane 2. When the ion conductive materials are the same as materials of the electrolyte membrane 2, a preferred result can be obtained. As a method of bringing the oxidizer electrode 3 in close contact with the ion exchange membrane 2, the know method including the hot pressing method and the cast film-forming method may be used. As the oxidizer electrode 3 other than carbon supporting platinum, the known materials such as a precious metal or a carrier (electrode catalyst) thereof and an organometallic complex or a calcination thereof may be used. Further, the oxidizer electrode 3 may be used in an unsupported state where the materials are not supported by the carrier as it stands. In the FIGURE, the assembly of the ion exchange membrane 2, the oxidizer electrode 3 and the fuel electrode 4 is referred to as a "membrane electrode assembly 7".

An oxidizer introduction hole (not shown) for introducing oxidizer (air in most cases) is formed in the upper portion of the oxidizer electrode 3. An oxidizer discharge hole (not shown) for discharging non-reacted air and a product (water in most cases) is formed in the lower portion thereof. In this case, a compulsory exhauster and/or compulsory exhaust means may be additionally disposed. A spontaneous convection hole for may be formed in the chassis 1a.

The liquid fuel channel 6 is provided outside the fuel electrode 4. The liquid fuel channel 6 may be a channel for fluid communication with an external fuel storing portion (not shown) or with a portion for storing methanol fuel. A discharge hole (not shown) for discharging non-reacted methanol fuel and a product ($CO_2$ in most cases) is formed in the lower portion of the fuel electrode 4. In this case, a compulsory discharger or compulsory means may be additionally disposed.

Methanol itself or mixture of methanol and water is suitable for fuel supplied to the fuel electrode 4. However, when the mixture of methanol and water is used as fuel, crossover can be effectively prevented, thereby obtaining better electromotive force and output.

Only unit cell is illustrated in a schematic diagram of a direct methanol fuel cell shown in the FIGURE. However, in the embodiment, the unit cell may be used as it stands, or a plurality of cells may be connected to one another in series or parallel to be used as a mounting fuel cell. As a method of connecting cell to cell, the known connection method using a bipolar plate may be employed or a planar connection method may be employed. It is also effective to employ the other known connection methods.

Ethanol, formic acid, or aqueous solution including at least one of them may be used as fuel, other than methanol.

EXAMPLES

Hereinafter, the invention will be described in detail by examples. However, the following examples are exemplified for specific description and the present invention is not limited to the examples.

(Catalyst for Production of Anode by Sputtering)

Examples 1 to 24 and 30 to 45, and Comparative Examples 1 to 19

A carbon black carrier (Product Name: VulcanXC72 manufactured by Cabot Corporation, and Specific Surface Area: about 230 $m^2/g$) was sufficiently dispersed. Next, the dispersed carrier was put on a holder in a chamber of an ion beam sputtering apparatus, a degree of vacuum became $3\times10^{-6}$ Torr ($0.4\times10^{-3}$ Pa) or less, and then Ar gas flowed in. While the carrier was being stirred, a target alloyed by the above-described manner was sputtered to have various kinds of compositions shown in Table 1.

TABLE 1

| | Catalyst Composition | Catalyst Method | Voltage (V) | Ta Peak Area Ratio (Oxygen Bond/ Metal Bond: Times) | T Peak Area Ratio (Oxygen Bond/ Metal Bond: Times) | T Peak Area Ratio (Metal Bond/ Oxygen Bond: Times) | Deterioration (%) |
|---|---|---|---|---|---|---|---|
| Ex. 1 | Pt40Ru50Ta5Hf5 | Sputtering | 0.45 | 0.35 | — | 1.4 | 0.5 |
| Ex. 2 | Pt45Ru35Ta10Hf10 | Sputtering | 0.43 | 0.6 | — | 0.4 | 0.4 |
| Ex. 3 | Pt50Ru38Ta0.5Hf11.5 | Sputtering | 0.45 | 0.2 | — | 0.5 | 0.5 |
| Ex. 4 | Pt45Ru45Ta5W5 | Sputtering | 0.49 | 0.3 | 0.3 | — | 0.3 |
| Ex. 5 | Pt43Ru43Ta7W7 | Sputtering | 0.49 | 0.35 | 0.3 | — | 0.3 |
| Ex. 6 | Pt57Ru30Ta3W10 | Sputtering | 0.47 | 0.35 | 0.3 | — | 0.3 |
| Ex. 7 | Pt45Ru45Ta5Ni5 | Sputtering | 0.48 | 0.4 | 0.4 | — | 0.3 |
| Ex. 8 | Pt40Ru48Ta5Ni7 | Sputtering | 0.45 | 1.6 | 0.45 | — | 0.8 |
| Ex. 9 | Pt40Ru55Ta4.5Ni0.5 | Sputtering | 0.46 | 0.5 | 0.8 | — | 0.6 |
| Ex. 10 | Pt40Ru40Ta5V15 | Sputtering | 0.46 | 1 | 0.45 | — | 0.6 |
| Ex. 11 | Pt60Ru20Ta10V10 | Sputtering | 0.44 | 1.2 | 0.8 | — | 0.4 |
| Ex. 12 | Pt45Ru40Ta5V10 | Sputtering | 0.49 | 0.3 | 0.8 | — | 0.4 |
| Ex. 13 | Pt50Ru40Ta5V5 | Sputtering | 0.48 | 1.3 | 0.8 | — | 0.6 |
| Ex. 14 | Pt45Ru40Ta5Cr10 | Sputtering | 0.45 | 0.35 | — | 0.4 | 0.4 |
| Ex. 15 | Pt50Ru35Ta8Cr7 | Sputtering | 0.43 | 1.9 | — | 0.45 | 0.8 |
| Ex. 16 | Pt47Ru42Ta6Nb5 | Sputtering | 0.46 | 0.3 | — | 0.7 | 0.4 |
| Ex. 17 | Pt40Ru45Ta10Nb5 | Sputtering | 0.45 | 0.3 | — | 0.5 | 0.3 |
| Ex. 18 | Pt45Ru40Ta5Nb10 | Sputtering | 0.44 | 0.8 | — | 0.6 | 0.5 |
| Ex. 19 | Pt45Ru45Ta5Zr5 | Sputtering | 0.45 | 0.4 | — | 0.35 | 0.3 |
| Ex. 20 | Pt55Ru30Ta8Zr7 | Sputtering | 0.45 | 0.45 | — | 0.55 | 0.5 |
| Ex. 21 | Pt65Ru10Ta15Zr10 | Sputtering | 0.44 | 1.5 | — | 0.8 | 0.3 |
| Ex. 22 | Pt52Ru40Ta3Ti5 | Sputtering | 0.45 | 0.3 | — | 1.2 | 0.4 |
| Ex. 23 | Pt40Ru40Ta10Ti10 | Sputtering | 0.44 | 0.3 | — | 0.8 | 0.3 |
| Ex. 24 | Pt45Ru40Ta5Ti10 | Sputtering | 0.45 | 0.35 | — | 0.3 | 0.3 |
| Ex. 25 | Pt45Ru40Ta7Hf8 | Deposition | 0.47 | 0.4 | — | 0.75 | 0.4 |
| Ex. 26 | Pt45Ru40Ta10W5 | Deposition | 0.49 | 0.3 | 0.4 | — | 0.4 |
| Ex. 27 | Pt40Ru50Ta5Mo5 | Deposition | 0.46 | 0.4 | 0.3 | — | 0.4 |
| Ex. 28 | Pt45Ru45Ta5Zr5 | Deposition | 0.46 | 0.3 | — | 0.4 | 0.5 |
| Ex. 29 | Pt45Ru45Ta5W5 | Solution | 0.4 | almost oxide | almost oxide | — | 1 |
| Ex. 30 | Pt40Ru55Ta2.5Hf2.5 | Sputtering | 0.48 | 0.9 | — | — | 0.2 |
| Ex. 31 | Pt22u25Ta18Hf35 | Sputtering | 0.49 | 2.2 | — | 0.6 | 0.1 |
| Ex. 32 | Pt33Ru19Ta18V20Hf10 | Sputtering | 0.5 | 1.8 | — | — | 0.2 |
| Ex. 33 | Pt35Ru30Ta8Hf11Ni16 | Sputtering | 0.47 | 1.2 | — | — | 0.3 |
| Ex. 34 | Pt90Ru5Ta3W2 | Sputtering | 0.47 | 0.45 | 0.6 | — | 0.3 |
| Ex. 35 | Pt50Ru5Ta35W10 | Sputtering | 0.47 | 1.1 | 0.7 | — | 0.1 |
| Ex. 36 | Pt32Ru30Ta8W30 | Sputtering | 0.5 | 0.65 | 0.3 | — | 0.3 |
| Ex. 37 | Pt10Ru30Ta30W30 | Sputtering | 0.49 | 1.6 | 0.8 | — | 0.1 |
| Ex. 38 | Pt82Ru5Ta11Ni2 | Sputtering | 0.48 | 0.5 | 0.55 | — | 0.2 |
| Ex. 39 | Pt30Ru20Ta30Ni20 | Sputtering | 0.48 | 1.2 | 0.3 | — | 0.1 |
| Ex. 40 | Pt25Ru16Ta18Ni23 | Sputtering | 0.49 | 0.4 | 0.6 | — | 0.2 |
| Ex. 41 | Pt50Ru29Ta5Ni3Mo8W5 | Sputtering | 0.49 | 1.4 | — | — | 0.3 |
| Ex. 42 | Pt75Ru5Ta10V10 | Sputtering | 0.48 | 0.8 | 0.8 | — | 0.2 |
| Ex. 43 | Pt83Ru5Ta2V10 | Sputtering | 0.49 | 1.3 | 0.65 | — | 0.2 |
| Ex. 44 | Pt65Ru2Ta3V30 | Sputtering | 0.49 | 0.7 | 0.2 | — | 0.3 |
| Ex. 45 | Pt65Ru20Ta20V5 | Sputtering | 0.5 | 1.1 | 1.3 | — | 0.1 |
| Comparative Ex. 1 | Pt40Ru55Ta2.5Hf2.5 | Sputtering | 0.41 | 0.45 | — | 0.45 | 0.4 |
| Comparative Ex. 2 | Pt35Ru46Ta4W15 | Sputtering | 0.39 | 0.8 | 0.6 | — | 0.4 |
| Comparative Ex. 3 | Pt35Ru42Ta19V4 | Sputtering | 0.39 | 0.6 | 0.6 | — | 0.1 |
| Comparative Ex. 4 | Pt45Ru30Ta8V17 | Sputtering | 0.4 | 0.4 | 1.2 | — | 0.4 |
| Comparative Ex. 5 | Pt28Ru28Ta40V4 | Sputtering | 0.37 | 0.7 | 0.5 | — | 0.1 |
| Comparative Ex. 6 | Pt75Ru20Ta2.5Cr2.5 | Sputtering | 0.4 | 0.45 | — | 1.9 | 0.2 |
| Comparative Ex. 7 | Pt30Ru60Ta5Cr5 | Sputtering | 0.39 | 0.7 | — | 0.4 | 0.6 |
| Comparative Ex. 8 | Pt41Ru55Ta3Mo1 | Sputtering | 0.39 | 0.8 | 0.45 | — | 0.4 |
| Comparative Ex. 9 | Pt42Ru27Ta10Mo21 | Sputtering | 0.38 | 0.5 | 0.2 | — | 0.3 |
| Comparative Ex. 10 | Pt45Ru30Ta18Zr7 | Sputtering | 0.39 | 0.55 | — | 0.6 | 0.2 |
| Comparative Ex. 11 | Pt50Ru50 | Sputtering | 0.42 | — | — | — | 0.5 |
| Comparative Ex. 12 | Pt20Ru18Ta41Hf21 | Sputtering | 0.37 | 3 | — | 0.8 | 0.2 |
| Comparative Ex. 13 | Pt99Ru0.5Ta0.1W0.4 | Sputtering | 0.37 | 0.4 | 0.5 | — | 0.5 |
| Comparative Ex. 14 | Pt9Ru40Ta23W28 | Sputtering | 0.36 | 1.5 | 0.4 | — | 0.2 |
| Comparative Ex. 15 | Pt25Ru25Ta10W40 | Sputtering | 0.36 | 0.8 | 0.4 | — | 0.3 |
| Comparative Ex. 16 | Pt30Ru58Ta4Ni8 | Sputtering | 0.39 | 0.5 | 1.5 | — | 0.2 |
| Comparative Ex. 17 | Pt32Ru26Ta5Ni37 | Sputtering | 0.38 | 1.1 | 0.8 | — | 0.5 |
| Comparative Ex. 18 | Pt50Ru50 | Sputtering | 0.45 | — | — | — | 0.5 |

An acid washing treatment was performed on the obtained product with sulfuric acid aqueous solution (sulfuric acid: 10 g and water: 200 g), a water washing was performed on the product, and then the product was dried.

(Catalyst for Production of Anode by Deposition)

Examples 25 to 28

A carbon black carrier (Product Name: VulcanXC72 manufactured by Cabot Corporation, and Specific Surface Area: about 230 m$^2$/g) was sufficiently dispersed. Next, the dispersed carrier was put on a holder in a chamber of a laser pulse deposition apparatus, a degree of vacuum became $3 \times 10^{-6}$ Torr ($0.4 \times 10^{-3}$ Pa) or less, and then Ar gas flowed in. While the carrier was being stirred at the carrier temperature shown in Table 1, a target alloyed by the above-described manner was deposited to have various kinds of compositions shown in Table 1. An acid washing treatment was performed on the obtained product with sulfuric acid aqueous solution (sulfuric acid: 10 g and water: 200 g), a water washing was performed on the product, and then the product was dried.
(Catalyst for Production of Anode by Solution Method)

Example 29

Carbon black of 500 mg (Product Name: VulcanXC72 manufactured by Cabot Corporation, and Specific surface Area: about 230 m$^2$/g) was added to Ethanol of 1000 mL containing chloride tantalum of 32.7 mg as tantalum metal and tungsten chloride of 33.27 mg as tungsten metal, was uniformly dispersed by sufficiently stirring, and then was heated at 55° C. under the stirring, thereby volatilizing and removing ethanol. Then, the residue obtained in the above-described manner was heated at 300° C. for 3 hours while hydrogen gas flowed in at a flow rate of 50 ml/min, thereby supporting tantalum and tungsten on the carbon black. Then, cyclohexane solution of 300 ml containing 1,5-cyclooctadienedimethyl platinum of 317.7 mg as platinum metal was mixed with ethanol solution 40 ml containing ruthenium chloride of 164.4 mg as ruthenium metal, the above-mentioned tantalum and tungsten-supported carbon was added to the mixed solution, the mixed solution was uniformly dispersed by sufficiently stirring, and then the mixed solution was heated at 55° C. under the mixing thereby volatilizing and removing solvent. Then, the residue obtained in the above-described manner was heated at 300° C. for 3 hours while hydrogen gas flowed in at a flow rate of 50 ml/min, thereby supporting platinum, ruthenium, tantalum and tungsten on the carbon black. As a result, a supported catalyst was obtained.

(Evaluation by X-Ray Photoelectron Spectroscopy (XPS))

The XPS measurement was performed on the catalyst using Quantum-2000 manufactured by PHI Corporation. In the XPS measurement, a sample is irradiated with X-ray, and thus identification and chemical state of the sample can be seen on the basis of photoelectrons sputtered from the sample. When any metal exists, peak of electrons derived from the metal or peak of photoelectrons derived from oxides having different chemical states can be detected in each energy range. However, it is limited that photoelectrons to which the XPS measurement can be performed are in a depth of several nm.

Charge-up compensation and electrification compensation (Cls: C-C284.6 eV) were performed using a neutralization gun (electronic gun and argon gun). Specifically, in a case of Ta and T that is at least one element selected from the group consisting of W, V, Co, and Ni, a ratio of a peak area of an oxygen bond to a peak area of a metal bond, which was obtained by the XPS, is shown in Table 1. In a case of Ta and T that is at least one element selected from the group consisting of Hf, Cr, Ti, Nb, and Zr, a ratio of a peak area of a metal bond to a peak area of an oxygen bond, which was obtained by the XPS, is shown in Table 1. The measured sample is a catalyst washed by acid. The amount of the oxidation bond of the catalyst before performing the acid washing may be greater than that after performing the acid washing. However, most of such cases occur due to an unstable oxidized layer. When the acid washing was not performed, it was conformed that the unstable oxidized layer was naturally changed to a stable oxidized layer even during generating electricity, and the peak area ratio of the oxidation bond in which the acid washing was not performed was the same level as that of the case in which the acid washing is performed. Energy of spectrum used for each element is shown in Table 2.

TABLE 2

| Element | Range of Peak by Metal Bond: eV | Range of Peak by Oxygen Bond: eV |
|---|---|---|
| V | 512 to 513 (2p3/2) | 516 to 517 (2p3/2) |
| W | 31 to 34 (4f7/2) | 36 to 40 (4f5/2) |
| Mo | 227 to 228 (3d5/2) | 235 to 237 (3d5/2) |
| Nb | 202 to 203 (3d5/2) | NbO: 203 to 205 (3d3/2) |
|   |   | Nb2O5: 209 to 211 (3d5/2) |
| Cr | 574 (2p3/2) | 576 to 580 (2p3/2) |
| Zr | 178 to 179 (3d5/2) | ZrO2: 184 to 185 (3d5/2) |
| Ti | 454 (2p3/2) | TiO: 455 (2p3/2) |
|   |   | TiO2: 459 (in this case, peak may not be shown due to overlapping with Ru) |
| Ta | 23 to 24 (4f4/2) | 27 to 29 (4f5/2) |
| Sn | 493 to 494 (3d3/2) | 494 to 496 (3d3/2) |
| Hf | 14 to 15 (4f7/2) | 17 to 19 (4f5/2) |

Examples 1 to 45 and Comparative Examples 1 to 18 were used as anode catalysts, and each of them was combined with a standard cathode electrode (product on the market for carbon-black-supported Pt catalyst, manufactured by TANAKA PRECIOUS METALS). Then, a fuel cell electrode, a membrane electrode assembly, and a unit cell were manufactured and evaluated.

<Anode Electrode>

Various kinds of the obtained catalysts were weighed by 3 g. These supported catalysts were sufficiently mixed with pure water of 8 g; 20% Nafion solution of 15 g; and 2-ethoxyethanol of 30 g and were dispersed, thereby producing a slurry. The slurry was applied by a control coater to a carbon paper (350 μm, manufactured by Toray Industries), on which water repellent treatment was performed. Then, the slurry was dried, thereby manufacturing an anode electrode in which a loading density of a precious metal catalyst is 1 mg/cm$^2$.

<Cathode Electrode>

First, a Pt catalyst manufactured by TANAKA PRECIOUS METALS was weighed by 2 g, was sufficiently mixed with pure water of 5 g; 20% Nafion solution of 5 g; and 2-ethoxyethanol of 20 g, and was dispersed, thereby producing a slurry. The slurry was applied by a control coater to a carbon paper (350 μM, manufactured by Toray Industries), on which water repellent treatment was performed. Then, the slurry was dried, thereby manufacturing a cathode electrode in which a loading density of a precious metal catalyst is 2 mg/cm$^2$.

<Manufacture of Membrane Electrode Assembly>

Each of the cathode electrode and the anode electrode was cut into a square of 3.2 cm×32 cm so as to have an area of 10 cm$^2$. Nafion 117 (Manufactured by Du Pont Corporation) as a proton-conductive solid-polymer membrane was interposed between the cathode electrode and the anode electrode and then was thermally pressed at 125° C. for 10 minutes under the pressure of 30 kg/cm$^2$, thereby manufacturing a membrane electrode assembly.

The evaluations of Examples 1 to 29 and Comparative Examples 1 to 11 were performed under the following condition (Condition A).

A unit cell of a fuel-direct-supplying polymer-electrolyte fuel cell was manufactured by the use of the membrane electrode assembly and a channel plate. 1M methanol solution as fuel was supplied to the unit cell at a flow rate of 0.6 ml/min and air was supplied to the cathode electrode at a flow rate of 200 ml/min. Then, the cell was discharged with a current density of 150 mA/cm$^2$ while the cell was kept 65° C. After 30 minutes elapsed, voltage of the cell was measured. With respect to a high stability, electricity of the unit cell was generated by the unit cell for 500 hours under the above-mentioned driving conditions and then deterioration of the unit cell was evaluated on the basis of a decreasing rate of voltage at current density of 150 mA/cm². The result is shown in Table 1.

The evaluations of Examples 30 to 45 and Comparative Examples 12 to 18 were performed under the following condition (Condition B).

As in Condition A above, a unit cell of a fuel-direct-supplying polymer-electrolyte fuel cell was manufactured by the use of the membrane electrode assembly and a channel plate. 1M methanol solution as fuel was supplied to the unit cell at a flow rate of 0.9 ml/min and air was supplied to the cathode electrode at a flow rate of 250 ml/min. Then, the cell was discharged with a current density of 150 mA/cm² while the cell was kept 70° C. After 30 minutes elapsed, voltage of the cell was measured. With respect to a high stability, electricity of the unit cell was generated by the unit cell for 500 hours under the above-mentioned driving conditions and then deterioration of the unit cell was evaluated on the basis of a decreasing rate of voltage at current density of 150 mA/cm². The result is shown in Table 1.

As shown in the result of Table 1, it can be found that the catalysts of Examples 1 to 13, 25 and 26 in which the main additive element T is Hf, W, Ni, or V have higher activity than that of the PtPu catalyst of Comparative Example 11 (Condition A).

Also, it can be found that even under Condition B which differs from Condition A in flow rates of methanol and air and temperature of the unit cell, the catalysts of Examples 30 to 45 have higher activity than that of the PtPu catalyst of Comparative Example 18 (Condition B).

As is clear from the comparison of the results of Examples, Comparative Examples 1 and 2 (Condition A) and Comparative Examples 13, 14 and 15 (Condition B), it can be found that the voltage in the case where Pt and Ru were deviated from the range of 10 to 98.9 atm % and the range of 0.1 to 50 atm %, respectively, is lower than that of the cases under the same measurement condition (for example, Comparative Example 1 (Condition A) and Comparative Example 18 (Condition B)). Also, By comparison of Examples and Comparative Examples 12, 13, 16 and 17 with the PtRu catalyst of Comparative Example 18, it can be found that the voltage is low when Ta or T were deviated from the range of 0.5 to 35 atm %.

It can be found by comparison of Examples 4 to 6 with Comparative Examples 11 and 18 that the deterioration can be decreased by adding Ta.

When Example 4 is compared with Example 29 as a difference in process, it can be found that the catalyst produced by the sputtering method has higher activity than and lower deterioration than the catalyst produced by the solution method. It is considered that this is because Ta of the catalyst produced by the solution method and W do not have the metal bond and most of them exist as oxides.

As shown in the result of Table 1, in the cases where the main additive element T is Cr, Mo, Nb, Zr, or Ti, it can be found that the catalyst activity in Examples 14 to 24, 27 and 28 is higher than that in the PtRu catalyst of Comparative Example 11.

From the results of Examples and Comparative Examples 6 to 8, it can be found that when Pt and Ru were deviated from the range of 40 to 70 atm % and the range of 0.5 to 50 atm %, respectively, the voltage is lower than that of the PtRu catalyst of Comparative Example 11 evaluated under the same measurement condition.

Also, from the results of Examples and Comparative Examples 7 to 10, it can be found that when Ta or T was deviated from the range of 0.5 to 15 atm %, the voltage is lower than that of the PtRu catalyst of Comparative Example 11.

It was confirmed that the above-mentioned tendency was shown also in a reforming-gas polymer fuel cell. Accordingly, the catalyst of the invention is more effective in CO poisoning than the known PtRu catalyst.

As described above, the invention can provide the catalyst with high activity and the fuel cell with high output power.

Examples 46 to 54 and 57 to 70, and Comparative Examples 20 and 22 to 29

A carbon black carrier (Product Name: VulcanXC72 manufactured by Cabot Corporation, and Specific Surface Area: about 230 m²/g) was sufficiently dispersed. Next, the dispersed carrier was put on a holder in a chamber of an ion beam sputtering apparatus, a degree of vacuum became $3 \times 10^{-6}$ Ton or less, and then Ar gas flowed in. While the carrier was being stirred, a target alloyed by the above-described manner was sputtered to have various kinds of compositions shown in Table 3.

TABLE 3

| | Catalyst Composition | Method of Producing Catalyst | Ta Peak Area Ratio (Oxygen Bond/ Metal Bond: Times) | T Peak Area Ratio (Oxygen Bond/ Metal Bond: Times) | Voltage (V) | Deterioration (%) |
|---|---|---|---|---|---|---|
| Ex. 46 | Pt45Ru45Ta5W5 | Sputtering | 0.3 | 0.3 | 0.49 | 0.3 |
| Ex. 47 | Pt43Ru43Ta7W7 | Sputtering | 0.35 | 0.3 | 0.49 | 0.3 |
| Ex. 48 | Pt57Ru30Ta3W10 | Sputtering | 0.35 | 0.3 | 0.47 | 0.3 |
| Ex. 49 | Pt40Ru40Ta5V15 | Sputtering | 1.0 | 0.45 | 0.46 | 0.6 |
| Ex. 50 | Pt60Ru20Ta10V10 | Sputtering | 1.2 | 0.8 | 0.44 | 0.4 |
| Ex. 51 | Pt45Ru40Ta5V10 | Sputtering | 0.3 | 0.8 | 0.49 | 0.4 |
| Ex. 52 | Pt50Ru40Ta5V5 | Sputtering | 1.3 | 0.8 | 0.48 | 0.6 |
| Ex. 53 | Pt45Ru45Ta5Ni5 | Sputtering | 0.4 | 0.4 | 0.48 | 0.3 |
| Ex. 55 | Pt40Ru48Ta5Ni7 | Sputtering | 1.6 | 0.45 | 0.45 | 0.8 |
| Ex. 55 | Pt40Ru50Ta5Mo5 | Vapor Deposition | 0.4 | 0.3 | 0.46 | 0.4 |
| Ex. 56 | Pt45Ru40Ta10W5 | Vapor Deposition | 0.3 | 0.4 | 0.49 | 0.4 |
| Comp. Ex. 20 | Pt50Ru45W5 | Sputtering | — | 1.3 | 0.48 | 2 |
| Comp. Ex. 21 | Pt45Ru45Ta5W5 | Solution Method | almost oxide | almost oxide | 0.40 | 1 |
| Comp. Ex. 22 | Pt36Ru36Ta18W10 | Sputtering | 0.45 | 0.45 | 0.40 | 0.2 |
| Comp. Ex. 23 | Pt45Ru30Ta8V17 | Sputtering | 0.4 | 1.2 | 0.40 | 0.5 |
| Ex. 57 | Pt40Ru50Ta5Hf5 | Sputtering | 0.35 | 1.4 | 0.45 | 0.5 |

TABLE 3-continued

|  | Catalyst Composition | Method of Producing Catalyst | Ta Peak Area Ratio (Oxygen Bond/ Metal Bond: Times) | T Peak Area Ratio (Oxygen Bond/ Metal Bond: Times) | Voltage (V) | Deterioration (%) |
|---|---|---|---|---|---|---|
| Ex. 58 | Pt45Ru35Ta10Hf10 | Sputtering | 0.6 | 0.4 | 0.43 | 0.4 |
| Ex. 59 | Pt45Ru40Ta5Cr10 | Sputtering | 0.35 | 0.4 | 0.45 | 0.4 |
| Ex. 60 | Pt50Ru35Ta8Cr7 | Sputtering | 1.9 | 0.45 | 0.43 | 0.8 |
| Ex. 61 | Pt52Ru40Ta3Ti5 | Sputtering | 0.30 | 1.2 | 0.45 | 0.4 |
| Ex. 62 | Pt40Ru40Ta10Ti10 | Sputtering | 0.30 | 0.8 | 0.44 | 0.3 |
| Ex. 63 | Pt45Ru40Ta5Ti10 | Sputtering | 0.35 | 0.3 | 0.45 | 0.3 |
| Ex. 64 | Pt47Ru42Ta6Nb5 | Sputtering | 0.30 | 0.7 | 0.46 | 0.4 |
| Ex. 65 | Pt40Ru45Ta10Nb5 | Sputtering | 0.3 | 0.5 | 0.45 | 0.3 |
| Ex. 66 | Pt45Ru40Ta5Nb10 | Sputtering | 0.8 | 0.6 | 0.44 | 0.5 |
| Ex. 67 | Pt45Ru45Ta5Zr5 | Sputtering | 0.4 | 0.35 | 0.45 | 0.3 |
| Ex. 68 | Pt55Ru30Ta8Zr7 | Sputtering | 0.45 | 0.55 | 0.45 | 0.5 |
| Ex. 69 | Pt65Ru10Ta15Zr10 | Sputtering | 1.5 | 0.8 | 0.44 | 0.3 |
| Ex. 70 | Pt74Ru15Zr15 | Sputtering | 0.8 | 0.7 | 0.43 | 0.2 |
| Ex. 71 | Pt45Ru45Ta5Zr5 | Vapor Deposition | 0.3 | 0.4 | 0.46 | 0.5 |
| Ex. 72 | Pt45Ru40Ta7Hf8 | Vapor Deposition | 0.4 | 0.75 | 0.47 | 0.4 |
| Comp. Ex. 24 | Pt40Ru35Ta5Hf20 | Sputtering | 0.7 | 0.4 | 0.39 | 0.6 |
| Comp. Ex. 25 | Pt75Ru20Ta2.5Cr2.5 | Sputtering | 0.45 | 1.9 | 0.40 | 0.3 |
| Comp. Ex. 26 | Pt30Ru60Ta5Cr5 | Sputtering | 0.7 | 0.4 | 0.39 | 0.6 |
| Comp. Ex. 27 | Pt40Ru55Ta2.5Hf2.5 | Sputtering | 0.45 | 0.45 | 0.41 | 0.4 |
| Comp. Ex. 28 | Pt35Ru45Ta8Hf12 | Sputtering | 0.3 | 0.5 | 0.40 | 0.4 |
| Comp. Ex. 29 | Pt50Ru50 | Sputtering | — | — | 0.42 | 0.5 |

An acid washing treatment was performed on the product by the use of sulfuric acid aqueous solution (sulfuric acid: 10 g and water: 200 g), a water washing was performed on the product, and then the product was dried.

Examples 55, 56, 71, and 72

A carbon black carrier (Product Name: VulcanXC72 manufactured by Cabot Area: about 230 m²/g) Corporation, and Specific Surface was sufficiently dispersed. Next, the dispersed carrier was put on a holder in a chamber of a laser pulse vapor deposition apparatus, a degree of vacuum became $3 \times 10^{-6}$ Torr or less, and then Ar gas flowed in. While the carrier was being stirred at the carrier temperature shown in Table 3, a target alloyed by the above-described manner was deposited to have various kinds of compositions shown in Table 3. An acid washing treatment was performed on the product by the use of sulfuric acid aqueous solution (sulfuric acid: 10 g and water: 200 g), a water washing was performed on the product, and then the product was dried.

Comparative Example 21

Carbon black of 500 mg (Product Name: VulcanXC72 manufactured by Cabot Corporation, and Specific surface Area: about 230 m²/g) was added to Ethanol of 1000 mL containing chloride tantalum of 32.7 mg as tantalum metal and tungsten chloride of 33.27 mg as tungsten metal, was uniformly dispersed by sufficiently stirring, and then was heated at 55° C. under the stirring, thereby volatilizing and removing ethanol. Then, the residue obtained in the above-described manner was heated at 300° C. for 3 hours while hydrogen gas flowed in at a flow rate of 50 ml/min, thereby supporting tantalum and tungsten on the carbon black. Then, cyclohexane solution of 300 ml containing 1,5-cyclooctadienedimethyl platinum of 317.7 mg as platinum metal was mixed with ethanol solution 40 ml containing ruthenium chloride of 164.4 mg as ruthenium metal, the above-mentioned tantalum and tungsten-supported carbon was added to the mixed solution, the mixed solution was uniformly dispersed by sufficiently stirring, and then the mixed solution was heated at 55° C. under the mixing thereby volatilizing and removing solvent. Then, the residue obtained in the above-described manner was heated at 300° C. for 3 hours while hydrogen gas flowed in at a flow rate of 50 ml/min, thereby supporting platinum, ruthenium, tantalum and tungsten on the carbon black. As a result, a supported catalyst was obtained.

The XPS measurement was performed on the catalyst using Quantum-2000 manufactured by PHI Corporation. In the XPS measurement, X-ray is applied to a sample and thus identification and chemical state of the sample can be seen on the basis of photoelectrons sputtered from the sample. When any metal exists, peak of electrons derived from the metal or peak of photoelectrons derived from oxides having different chemical states can be detected in each energy range. However, it is limited that photoelectrons to which the XPS measurement can be performed are in a depth of several nm.

Charge-up compensation and electrification compensation (Cls: C-C284.6 eV) are performed using a neutralization gun (electronic gun and argon gun). Specifically, in a case where Ta and T are at least one element selected from the group consisting of W, V, Co, and Ni, a ratio of a peak area of an oxygen bond to a peak area of a metal bond by the use of the XPS is shown in Table 3. In a case where Ta and T are at least one element selected from the group consisting of Hf, Cr, Ti, Nb, and Zr, a ratio of a peak area of a metal bond to a peak area of an oxygen bond is shown in Table 3. The measured sample is a catalyst washed by acid. The amount of the oxidation bond of the catalyst before performing the acid washing may be greater than that after performing the acid washing. However, most of such cases occur due to an unstable oxidized layer. When the acid washing was not performed, it was conformed that the unstable oxidized layer was naturally changed to a stable oxidized layer even during generating electricity and the peak area ratio of the oxidation bond in which the acid washing was not performed was the same level as that of the case in which the acid washing is performed. Energy of spectrum used for each element is shown in Table 4.

TABLE 4

| Element | Existence Range of Peak by Metal Bond: eV | Existence Range of Peak by Oxygen Bond: eV |
|---|---|---|
| V | 512 to 513 (2p3/2) | 516 to 517 (2p3/2) |
| W | 31 to 34 (4f7/2) | 36 to 40 (4f5/2) |
| Mo | 227 to 228 (3d5/2) | 235 to 237 (3d5/2) |
| Nb | 202 to 203 (3d5/2) | NbO: 203 to 205 (3d3/2) Nb2O5: 209 to 211 (3d5/2) |
| Cr | 574 (2p3/2) | 576 to 580 (2p3/2) |
| Zr | 178 to 179 (3d5/2) | ZrO2: 184 to 185 (3d3/2) |
| Ti | 454 (2p3/2) | TiO: 455 (2p3/2) TiO2: 459 (in this case, peak may not be shown due to overlapping with Ru) |
| Ta | 23 to 24 (4f4/2) | 27 to 29 (4f5/2) |
| Sn | 493 to 494 (3d3/2) | 494 to 496 (3d3/2) |
| Hf | 14 to 15 (4f7/2) | 17 to 19 (4f5/2) |

Examples 46 to 72 and Comparative Examples 20 to 29 were used as anode catalysts, and each of them was combined with a standard cathode electrode (product on the market for carbon-black-supported Pt catalyst, manufactured by TANAKA PRECIOUS METALS). Then, a fuel cell electrode, a membrane electrode assembly, and a unit cell were manufactured and evaluated.

<Anode Electrode>

Various kinds of the obtained catalysts were weighed by 3 g. These supported catalysts were sufficiently mixed with pure water of 8 g; 20% Nafion solution of 15 g; and 2-ethoxyethanol of 30 g and were dispersed, thereby producing a slurry. The slurry was applied by a control coater to a carbon paper (350 μm, manufactured by Toray Industries), on which water repellent treatment was performed. Then, the slurry was dried, thereby manufacturing an anode electrode in which a loading density of a precious metal catalyst is 1 mg/cm².

<Cathode Electrode>

First, a Pt catalyst manufactured by TANAKA PRECIOUS METALS was weighed by 2 g, was sufficiently mixed with pure water of 5 g; 20% Nafion solution of 5 g; and 2-ethoxyethanol of 20 g, and was dispersed, producing a slurry. The slurry was applied by a control coater to a carbon paper (350 μm, manufactured by Toray Industries), on which water repellent treatment was performed. Then, the slurry was dried, thereby manufacturing a cathode electrode in which a loading density of a precious metal catalyst is 2 mg/cm².

<Manufacture of Membrane Electrode Assembly>

Each of the cathode electrode and the anode electrode was cut into a square of 3.2 cm×3.2 cm so as to have an area of 10 cm². Nafion 117 (Manufactured by Du Pont Corporation) as a proton-conductive solid-polymer membrane was interposed between the cathode electrode and the anode electrode and then was thermally pressed at 125° C. for 10 minutes under the pressure of 30 kg/cm², thereby manufacturing a membrane electrode assembly.

A unit cell of a fuel-direct-supplying polymerelectrolyte fuel cell was manufactured by the use of the membrane electrode assembly and a channel plate. 1M methanol solution as fuel was supplied to the unit cell at a flow rate of 0.6 ml/min and air was supplied to the cathode electrode at a flow rate of 200 ml/min. Then, the cell was discharged with a current density of 150 mA/cm² while the cell was kept 65° C. After 30 minutes elapsed, voltage of the cell was measured. Electricity was generated by the unit cell for 500 hours under the above-mentioned driving conditions and then the unit cell was evaluated with respect to a high stability on the basis of a decreasing rate of voltage at current density of 150 mA/cm². The result is shown in Table 3.

As shown in the result of Table 3, it could be appreciated that the catalysts of Examples 46 to 72 have higher activity than that of Comparative Example 29. However, when the other Examples were compared with Comparative Examples 25 to 28, it could be appreciated to degrade the performance in a case where Pt and Ru were deviated from the range of 40 to 70 atm % and the range of 0 to 50 atm %, respectively. It could be appreciated to decrease the deterioration by adding Ta. For example, when Example 46 is compared with Comparative Example 20, it can be appreciated to decrease the deterioration by adding Ta. The other Examples are compared with Comparative Examples 22, 23, and 24. In this case, it can be appreciated that the activity was remarkably degraded when the percentage of the addition of Ta or T is greater than 15%. When Example 46 is compared with Comparative example 21 as a difference in process, it can be appreciated that the catalyst produced by the sputtering method has higher activity than and lower deterioration than the catalyst produced by the solution method. It is considered that this is because Ta of the catalyst produced by the solution method and W do not have the metal bond and most of them exist as oxides. It was confirmed that the above-mentioned tendency was shown also in a reforming-gas polymer fuel cell. Accordingly, the catalyst of the invention is more effective in CO poisoning than the known PtRu catalyst.

As described above, the invention can provide the catalyst with high activity and the fuel cell with high output power.

The invention is not limited to the above-described embodiments and the constituent elements of the invention may be modified in the technical scope of the invention. The plurality of constituent elements described in the above embodiments may be appropriately combined to achieve various kinds of inventions. For example, some of all the constituent elements described in the embodiments may be omitted. The constituent elements according to the different embodiments may be appropriately assembled.

What is claimed is:

1. A catalyst comprising fine catalyst particles of a composition represented by formula (1):

$$Pt_uRu_xTa_yT_z \qquad (1)$$

wherein T is at least one element selected from the group consisting of Hf, W, Ni, V, Cr, Mo, Nb, Zr, and Ti; and u, x, y, and z are 40 to 70 atm %, 0 to 50 atm %, 0.5 to 15 atm %, and 0.5 to 15 atm %, respectively, and wherein in an X-ray photoelectron spectroscopy, an amount of Ta having an oxygen bond is equal to or less than twice that of Ta having a metal bond.

2. The catalyst according to claim 1, wherein T is at least one element selected from the group consisting of W, Ni, Mo, V, and Cr; and in an X-ray photoelectron spectroscopy, an amount of T having an oxygen bond is equal to or less than twice that of T having a metal bond.

3. The catalyst according to claim 1, wherein T is at least one element selected from the group consisting of Hf, Nb, Zr, and Ti; and in an X-ray photoelectron spectroscopy, an amount of T having a metal bond is equal to or less than twice that of T having an oxygen bond.

4. The catalyst according to claim 1, wherein T is at least Hf.

5. The catalyst according to claim 1, wherein T is at least W.

6. The catalyst according to claim 1, wherein T is at least Ni.

7. The catalyst according to claim 1, wherein T is at least V.

8. The catalyst according to claim 1, wherein T is at least Cr.

9. The catalyst according to claim 1, wherein T is at least Mo.

10. The catalyst according to claim 1, wherein T is at least Nb.

11. The catalyst according to claim 1, wherein T is at least Zr.

12. The catalyst according to claim 1, wherein T is at least Ti.

13. A membrane electrode assembly comprising:
a cathode;
an anode including a catalyst according to claim 1; and
a proton-conductive membrane disposed between the cathode and the anode.

14. A fuel cell comprising a membrane electrode assembly according to claim 13.

15. The fuel cell according to claim 14, wherein a fuel including methanol or mixture of methanol and water is supplied to the anode.

16. A method for producing a catalyst, comprising forming catalyst particles in a conductive carrier by a sputtering method or a vapor deposition method, wherein the conductive carrier is kept at 400° C. or less during performing the sputtering method or the vapor deposition method, the catalyst particles having a composition represented by formula (1):

$$Pt_u Ru_x Ta_y T_z \qquad (1)$$

wherein T is at least one element selected from the group consisting of Hf, W, Ni, V, Cr, Mo, Nb, Zr, and Ti; and u, x, y, and z are 40 to 70 atm %, 0 to 50 atm %, 0.5 to 15 atm %, and 0.5 to 15 atm %, respectively, and wherein in an X-ray photoelectron spectroscopy, an amount of Ta having an oxygen bond is equal to or less than twice that of Ta having a metal bond.

17. The method according to claim 16, wherein said forming is by the sputtering method.

18. The method according to claim 16, wherein said forming is by the vapor deposition method.

19. The method according to claim 16, further comprising performing an acid washing treatment or a heat treatment to the catalyst particles.

20. The method according to claim 19, wherein the acid treatment is performed with a sulfuric acid aqueous solution.

21. The method according to claim 19, wherein the heat treatment is performed at a temperature of 10 to 400° C. and under an oxygen partial pressure of less than 5%.

* * * * *